US007257671B2

(12) United States Patent
Kanazawa

(10) Patent No.: US 7,257,671 B2
(45) Date of Patent: Aug. 14, 2007

(54) CONTENT ADDRESSABLE MEMORY CAPABLE OF CHANGING PRIORITY IN PRIORITY ENCODER

(75) Inventor: Naoki Kanazawa, Mihama-ku (JP)

(73) Assignee: Kawasaki Microelectronics, Inc., Chiba (JP)

( * ) Notice: Subject to any disclaimer, the term of this patent is extended or adjusted under 35 U.S.C. 154(b) by 292 days.

(21) Appl. No.: 10/854,282

(22) Filed: May 27, 2004

(65) Prior Publication Data
US 2005/0013179 A1  Jan. 20, 2005

(30) Foreign Application Priority Data
May 28, 2003 (JP) ............................ 2003-150716

(51) Int. Cl.
*G06F 13/00* (2006.01)
(52) U.S. Cl. ...................................... 711/108; 711/151
(58) Field of Classification Search ................ 711/108, 711/151
See application file for complete search history.

(56) References Cited
U.S. PATENT DOCUMENTS
4,996,666 A * 2/1991 Duluk, Jr. ................... 365/49

FOREIGN PATENT DOCUMENTS
JP     A 2001-014864    1/2001

* cited by examiner

*Primary Examiner*—Reba I. Elmore
(74) *Attorney, Agent, or Firm*—Oliff & Berridge, PLC

(57) ABSTRACT

A content addressable memory includes a plurality of word memories which respectively have assigned addresses, and each outputs a match/mismatch signal representing storage or no storage of a data item matching search data in a search mode, a priority encoder which output addresses of word memories which output the match signals in the search mode in predetermined fixed priority order, a first prior word-memory setting section for setting a first prior word memory, and a priority changing part which masks the match signals output from upper-positional word memories of the word memories, which correspond to word memories having upper positions compared with the first prior word memory in the fixed priority order in the priority encoder, and transmits signals representing that the word memories having the upper positions output no match signals to the priority encoder.

24 Claims, 14 Drawing Sheets

CONTENT ADDRESSABLE MEMORY CAPABLE OF CHANGING PRIORITY IN PRIORITY ENCODER

BACKGROUND OF THE INVENTION

1. Field of the Invention

The present invention relates to a content addressable memory (hereinafter referred to as a "CAM"), and in particular, to a priority encoder for use in a CAM.

2. Description of the Related Art

FIG. 13 is a circuit block diagram showing a CAM 10 as an example of a conventional CAM.

The CAM 10 shown in FIG. 13 includes a plurality of word memories 11a, 11b, . . . , 11n storing a bit pattern for one word. The CAM 10 includes a search data register 12 for latching one word of input search data. All or predetermined part of the bit pattern of search data latched by the register 12 is compared with the bit pattern of a portion of data stored in each word memory which corresponds to the all or a predetermined part of the bit pattern. This detects matching/mismatching between the two. Match/mismatch signals (also called "hit signals") representing matching or mismatching are output from the word memories 11a to 11n, and are stored in flag registers 13a, 13b, . . . , 13n provided for the word memories 11a to 11n, respectively. For example, in a flag-register for a word memory storing data, a portion of which matches the bit pattern of the search data, a high level flag representing matching is stored. In the other flag registers, low level flags representing mismatching are stored. The flag registers 13a to 13n output hit signals Sh to an address encoder 14. Based on the hit signals Sh, the address encoder 14 outputs the address AD of the word memory storing the high level flag. The address AD output from the address encoder 14 is input to an address decoder 15, if needed. The address decoder 15 decodes the input address AD and activates a word memory line among word memory lines 16a, 16b, . . . , 16n, which corresponds to the input address AD. This allows an output register 17 to read the data stored in a word memory connected to the activated word line.

As described above, the CAM 10 can perform searching for data stored in the word memories 11a to 11n by using all or a predetermined part of search data, obtaining the address of a word memory storing data, which matches the search data, and reading the entirety of the data stored in the word memory.

However, the number of word memories storing data which matches the all or predetermined part of the search data is not limited to one, but may be more than one. Accordingly, as the address encoder 14 in the CAM 10, a priority encoder is provided in which predetermined fixed priority order is assigned to the word memories 11a to 11n. When a plurality of word memories store data items matching all or predetermined part of search data, the priority encoder outputs sequentially the addresses AD of the word memories in accordance with the fixed priority order.

Recently, the increased memory capacity have brought about a case in which data items of two themes, for example, are stored by theme in a single CAM, and after data searching, addresses of words which store data item belonging to one theme needs to be output prior to other addresses as the search result.

FIG. 14 is a schematic illustration of a state in which data items of two themes are stored by theme in a conventional CAM.

Referring to FIG. 14, the data items of theme A are stored in upper word memories 11a, 11b, . . . , 11m−1, while the data items of theme B are stored in lower word memories 11m, . . . , 11n.

Here, the conventional CAM outputs the addresses of word memories obtained by searching in accordance with fixed priority order in the priority encoder. In FIG. 14, as indicated by the arrow, the priority order is represented in the order of the subscripted alphabetical letters of reference numerals denoting the word memories 11a to 11m−1, and 11m to 11n. In this case, the data items of theme A are stored in the word memories 11a to 11m−1, having higher priority, and the data items of theme B are stored in the word memories 11m to 11n, having lower priority.

Accordingly, in the case of attempting to output an address of word memory belonging to theme B prior to an address of word memory belonging to theme A, or to output only an address having the highest priority for the theme B, the conventional CAM sequentially outputs addresses in accordance with the fixed priority order in the priority encoder, regardless of the themes of stored data items.

Also, in the case of attempting to output only the addresses of word memories belong to theme B, the result of searching for the data items of theme B must be output after the result of searching for the data items of theme A, which is not necessary, is completely output.

In order for the conventional CAM to start to output the searching results for the data items of theme B, which is desired by a user, for example, in one method, before data searching is performed, data items stored in the CAM need to be arranged so that words storing the data items of theme B have higher priority and words storing the data items of theme A have lower priority. Also, in another method, after the results of searching are output from the CAM, the output results are rearranged so that the result of searching the data items of theme B has higher priority and the result of searching the data items of theme A has lower priority. However, these methods have a problem of complication in managing the data stored in the CAM and the results of searching output from the CAM.

SUMMARY OF THE INVENTION

In view of the above circumstances, it is an object of the present invention to provide a CAM in which the management of stored data items and search results is facilitated, and in which order of priority in a priority encoder can be changed while suppressing a decrease in throughput.

To achieve the above object, according to an aspect of the present invention, a content addressable memory is provided which includes a plurality of word memories which respectively have assigned addresses, and each outputs a match/mismatch signal representing storage or no storage of a data item matching search data in a search mode, and a priority circuit which changes the priority of the addresses of word memories which are to be output prior to the addresses of the other word memories.

According to another aspect of the present invention, a content addressable memory is provided which includes a plurality of word memories which respectively have assigned addresses, and each outputs a match/mismatch signal representing storage or no storage of a data item matching search data in a search mode, a plurality of flag registers which respectively correspond to the plurality of word memories, and which stores the match/mismatch signals output from the corresponding word memories, and a priority circuit which changes the priority of the addresses of word memories which are to be output prior to the addresses of the other word memories.

According to another aspect of the present invention, a content addressable memory is provided which includes a plurality of word memories which respectively have assigned addresses, and each outputs a match/mismatch signal representing storage or no storage of a data item matching search data, and a priority circuit which changes the priority of the addresses of word memories which are to be output prior to the addresses of the other word memories. The priority circuit includes a priority encoder which outputs the addresses of word memories among the plurality of word memories which output the match signals in the search mode in predetermined fixed priority order, a first prior word-memory setting section for setting a first prior word memory among the plurality of word memories, a last prior word-memory setting section for setting a last prior word memory among the plurality of word memories, and a priority changing part which, when data items matching the search data are stored in word memories which do not belong to an effective word memory region defined by the first prior word memory and the last prior word memory, masks the match signals output from the word memories and transmits the masked match signals to the priority encoder, and which, when the first prior word memory has a lower position compared with the last prior word memory, masks the match signals output from word memories which have upper positions compared with the first prior word memory and transmits the masked match signals to the priority encoder while the match signals are being output from word memories including the first prior word memory and having lower positions compared with the first prior word memory, and transmits to the priority encoder the match signals output from word memories including the last prior word memory and have upper positions compared with the last prior word memory while no match signal is being output from any one of the word memories having the lower positions.

DESCRIPTION OF THE PREFERRED EMBODIMENTS

Various embodiments of the present invention are fully described below with reference to the accompanying drawings.

Figure 1:
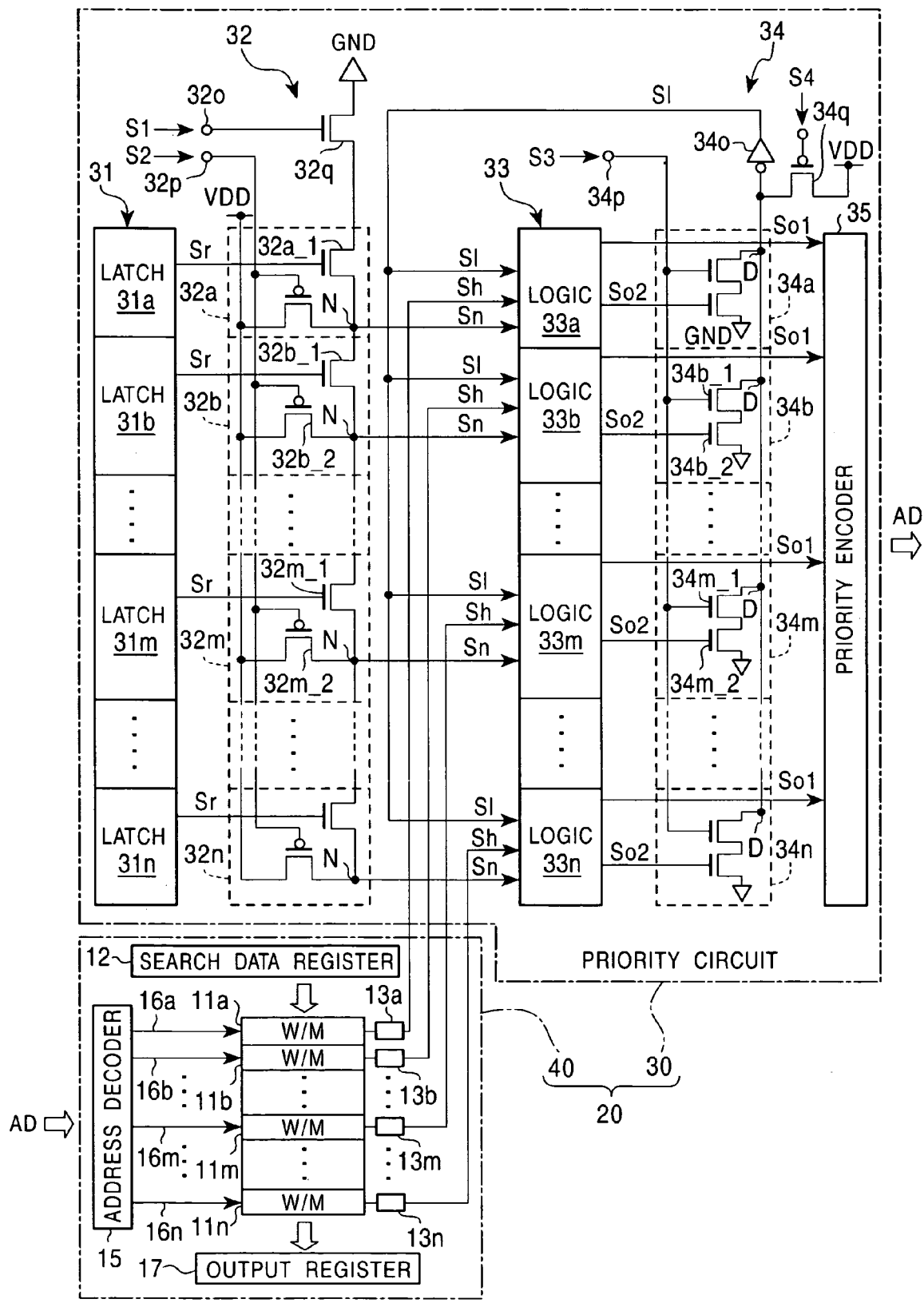
FIG. 1 is a block diagram showing a CAM according to a first embodiment of the present invention.

FIG. 1 is a block diagram showing a CAM 20 according to a first embodiment of the present invention.

Figure 13:
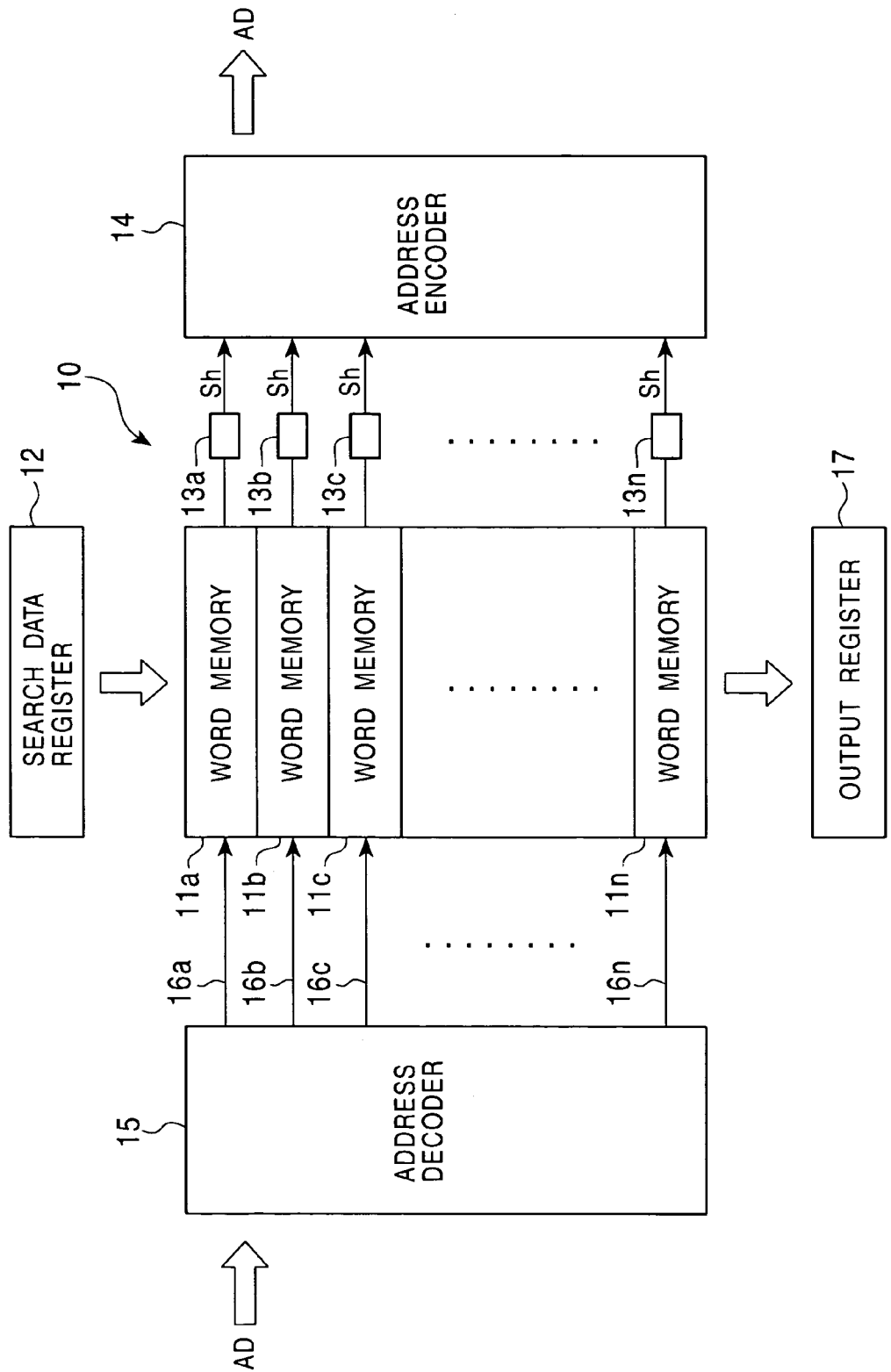
FIG. 13 is a block diagram showing an example of a conventional CAM.
Figure 14:
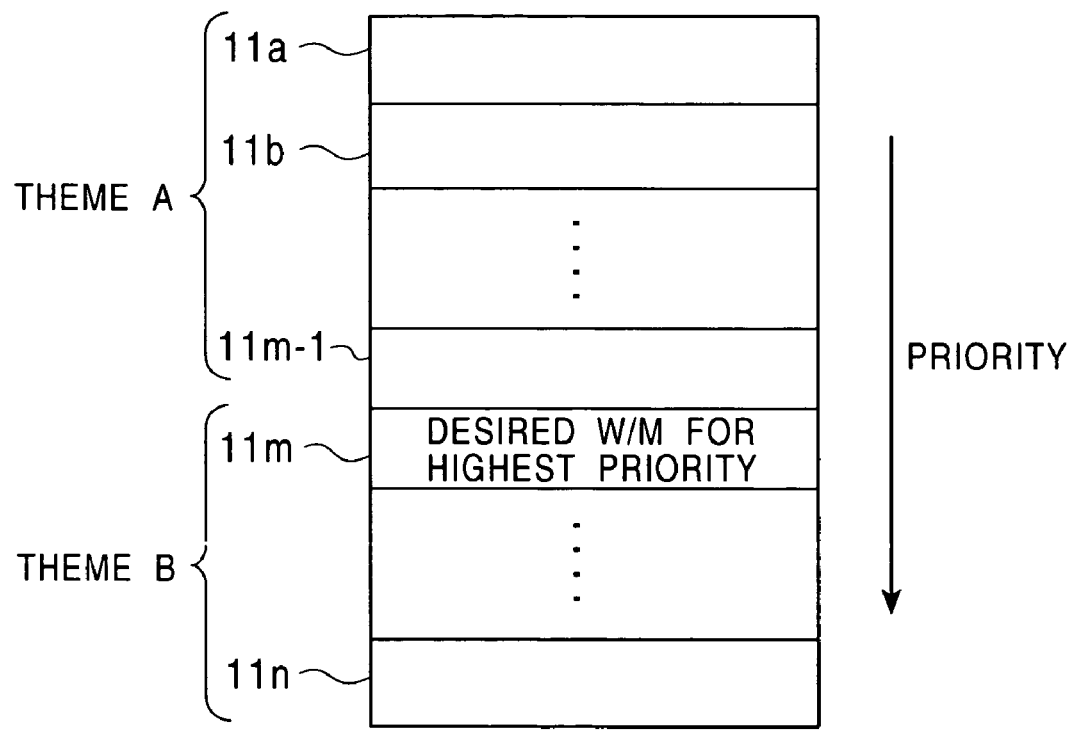
FIG. 14 is a schematic illustration of a state in which data items of two themes are stored by theme in a conventional CAM.

A portion of the CAM 20 which includes word memories 11a, 11b, . . . , 11n, a search data register 12, flag registers 13a, 13b, . . . , 13n, an address decoder 15, word memory lines 16a, 16b, . . . , 16n, and an output register 17 is identical in configuration and operation to the above portion of the conventional CAM 10 shown in FIG. 13. Accordingly, the components in the portion of the CAM 20 are denoted by identical reference numerals, and a detailed description of each component is omitted. The present invention is characterized by a priority circuit 30.

The priority circuit 30 includes a first prior word-memory setting unit (hereinafter referred to as "the first prior W/M setting section") 31, a division circuit 32, an upper-side mask circuit 33, a detection circuit 34, and a priority encoder 35. In the first embodiment, for a plurality of word memories, fixed priority levels in the priority encoder 35 are represented in the order of the subscripted alphabet letters of the reference numerals shown in FIG. 1.

The first prior W/M setting section 31 sets, from among word memories, a word memory whose address is to be output prior to the addresses of the other word memories. The first prior W/M setting section 31 consists of a plurality of latches 31a, 31b, . . . , 31n corresponding to the word memories 11a, 11b, . . . , 11n. The latches 31a to 31n are identical in circuit configuration to one another. The latches 31a to 31n each store a high level in initial state. When a first prior word memory is set by a user, a latch corresponding to the first prior word memory stores a low level. The latches 31a to 31n output, to the division circuit 32, latch signals Sr corresponding to data items stored in them. Or to put it another way, when each latch stores the high level, it outputs the latch signal Sr in high level, while, when each latch stores the low level, it outputs the latch signal Sr in low level.

The division circuit 32 divides the word memories into word memories which include the first prior word memory and which have lower positions compared with the first prior word memory in fixed order of priority set in the priority encoder 35, and word memories which have upper positions compared with the first prior word memory in the above fixed priority order. A plurality of division units 32a, 32b, . . . , 32n are provided one to one for the word memories, respectively. The division units 32a to 32n are identical in circuit configuration to one another. The latch signal Sr from each latch is input to the corresponding division unit.

By using the division unit 32m corresponding to the word memory 11m for an example, the circuit configuration is described below.

The division unit 32m includes an N-channel transistor (hereinafter referred to as "N-ch transistor") 32b_1 having a gate, to which the latch signal Sr is input from the latch 31b. The division unit 32m also includes a P-channel transistor (hereinafter referred to as "P-ch transistor") 32m_2 having a gate connected to a second control signal input terminal 32p. The P-ch transistor 32m_2 has a source connected to a power supply VDD, and a drain connected to the drain of the N-ch transistor 32m_1. The source of the N-ch transistor 32m_1 is connected to the drain of an N-ch transistor 32m−1_1 in the division unit 32m−1 (not shown in FIG. 1), which is adjacently positioned on the side of the ground GND.

The source of the N-ch transistor 32a_1 in the division unit 32a, which is closest to the ground GND, among the division units 32a to 32n, is connected to the drain of an N-ch transistor 32q having a source connected to the ground GND. The gate of the N-ch transistor 32q is connected to a first control signal input terminal 32o.

In the first embodiment, before setting a first prior word memory, a first control signal S1 having a low level is supplied to the first control signal input terminal 32o, and a second control signal S2 having a low level is supplied to the second control signal input terminal 32p. Accordingly, the N-ch transistor 32q is in off-state, and the P-ch transistors of all the division units are in on-state. Accordingly, nodes N in all the division units are high level by pre-charging via the P-ch transistors. As described above, in the initial state before the user designates the address of a first prior word memory, all the latches in the first prior word-memory setting section 31 store high levels.

At this time, when, for example, the word memory 11m is designated as a first prior word memory by the user, the latch 31m corresponding to the word memory 11m stores a low level. Then, the first and second control signals S1,S2 are made in high level. The signal Sr in low level is supplied to the gate of the N-channel transistor 32m_1 in the division unit 32m, so that the N-ch transistor 32m_1 is turned off. Consequently, this breaks the connection between the node N of division unit 32m−1 and the node N of division unit 32m. Thus, the nodes N in these division units 32m to 32n which are away from the ground GND compared with the division unit 32m have high level potential equal to that of the power supply VDD. Conversely, the node N of the division unit 32a to 32m−1, which is closer to the ground GND than the division unit 32m, remains connected to the ground GND via N-ch transistor 32q, so that it has low level potential. The potential of the node N in each division unit is supplied as a division signal Sn to the upper-side mask circuit 33. In this first embodiment, the division signals Sn in high level are output from the nodes N in the division units 32m to 32n corresponding to the word memories 11m to 11n, which have lower positions compared with the first prior word memory 11m, which includes the first prior word memory 11m.

As described above, the division circuit 32 divides the word memories 11a to 11n into lower-side word memories (includes the first prior word memory) and upper-side word memories. The division signals Sn are output from the division units to the upper-side mask circuit 33.

The upper-side mask circuit 33 consists of logic circuits 33a, 33b, . . . , 33n respectively provided for the word memories 11a to 11n. The division signal Sn is input to each logic circuit from the corresponding division unit. The logic circuits 33a to 33n are identical in circuit configuration to one another.

Next, by using the logic circuit 33m corresponding to the word memory 11m for an example, the logic circuit configuration is described below.

Figure 2:
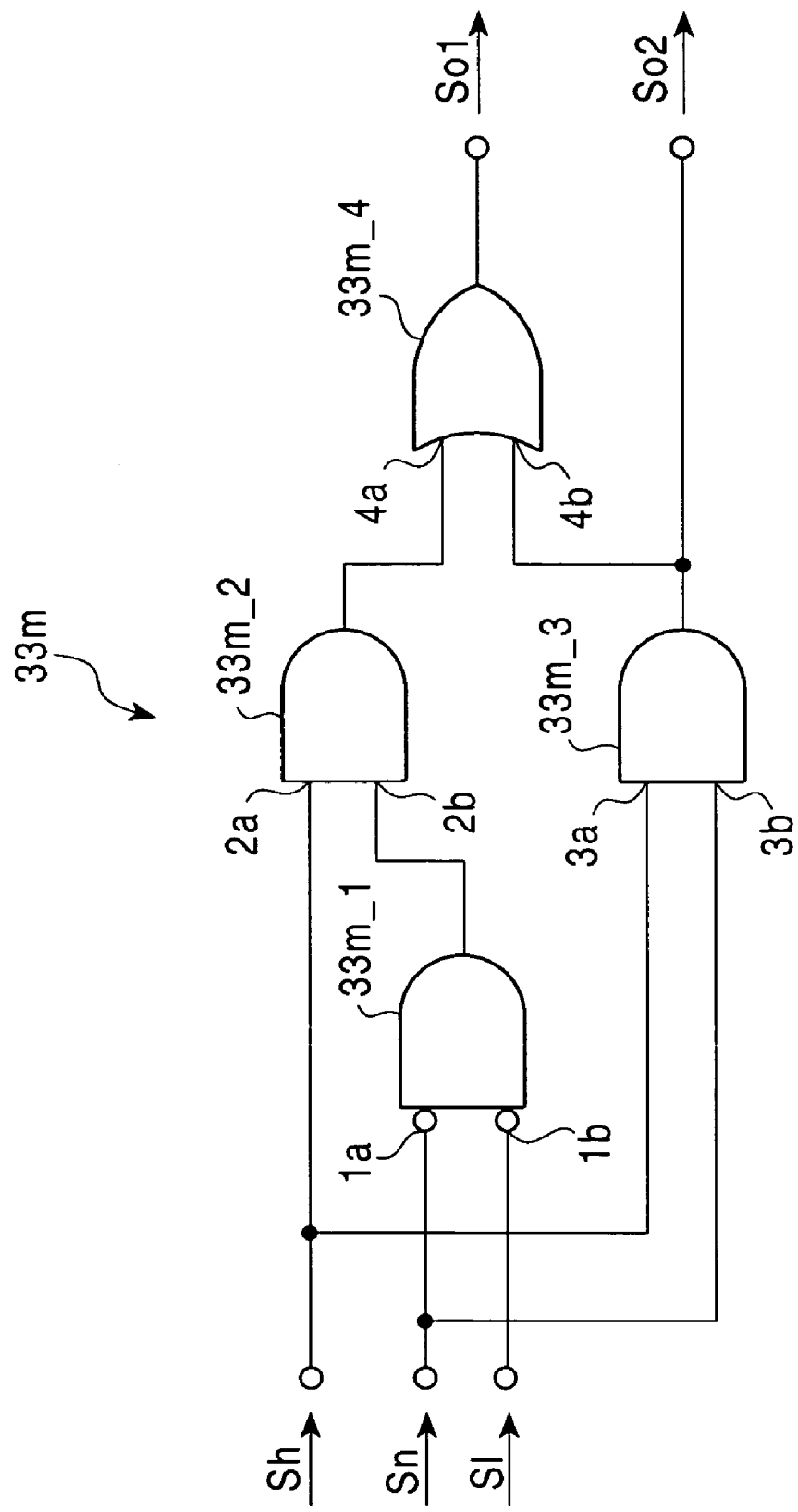
FIG. 2 is a circuit diagram showing the logic circuit shown in FIG. 1.

FIG. 2 is a circuit diagram showing the logic circuit 33m shown in FIG. 1.

The logic circuit 33m in FIG. 2 is constituted by a NOR gate 33m_1, two AND gates 33m_2 and 33m_3, and an OR gate 33m_4.

An input terminal 1a of the NOR gate 33m_1 is connected to the node N in the division unit 32m shown in FIG. 1. From this node N, the division signal Sn is input to the input terminal 1a. An input terminal 1b of the NOR gate 33m_1 is connected to the detection circuit 34 shown in FIG. 1. The division circuit 32 inputs a lower-side hit-detection signal S1 (described later) to the input terminal 1b. The lower-side hit-detection signal S1 is in high level when a hit flag (high level) is stored in one of lower flag registers corresponding to the lower-side word memories obtained by the division of the division circuit 32, while the lower-side hit-detection signal S1 is in low level when no hit flag (high level) is stored in one of the lower-side flag registers.

An input terminal 2a of the AND gate 33m_2 is connected to the flag register 13m corresponding to the word memory 11m (see FIG. 1), and a hit signal Sh is input to the input terminal 2a. An input terminal 2b of the AND gate 33m_2 is connected to an output terminal of the NOR gate 33m_1.

An input terminal 3a of the AND gate 33m_3 is connected to the flag register 13m, and an input terminal 3b of the AND gate 33m_3 is connected to the above detection circuit 34.

An input terminal 4a of the OR gate 33m_4 is connected to an output terminal of the AND gate 33m_2. An input terminal 4b is connected to an output terminal of the AND gate 33m_3.

A first output signal So1 of the logic circuit 33m is output from an output terminal of the OR gate 33m_4 to the priority encoder 35. When the first output signal So1 is in high level, the priority encoder 35 regards the flag register 13m corresponding to the logic circuit 33m as storing a hit flag (high level), and outputs the address AD of the word memory 11m.

In addition, a second output signal So2 of the logic circuit 33m is output from the output terminal of the AND gate 33m_3 to the detection circuit 34.

The second output signal So2 is in high level only in a case in which the word memory 11m is one of the equal or lower-positional word memories than the first prior word memory and a hit flag is stored in the flag register 13m (the division signal Sn and the hit signal Sh are both in high level). Other combinations of the two input signal Sn and Sh make the second output signal So2 in low level.

On the other hand, the first output signal So1 is in high level in the following two cases. One case is the case in which the second output signal So2 is in high level. Another case is the case in which the hit signal Sh is in high level, the division signal Sn is in low level and the lower-side hit detection signal Sl is in low level. Here, the hit signal is a signal output from a flag register and is identical to the match/mismatch signal in the present invention.

Therefore, in a case in which the word memory 11b is one of the upper-positional word memories by the division of the division circuit 32 (the division signal Sn is in low level), even if the flag register 13b stores a hit flag (high level), the logic circuit 33b outputs the first output signal So1 in low level to the priority encoder 35 when a hit flag (high level) is stored in one of the flag registers corresponding to the lower-positional word memories. In other words, in the above case, information indicating that the hit flag (high level) is stored in the flag register 13b is masked by the logic circuit 33b, even if the flag register 13b stores a hit flag. Accordingly, apparent information (the first output signal So1 is in low level) indicating that any hit flag (high level) is not stored in the flag register 13b is conveyed to the priority encoder 35.

In the above manner, when a hit flag is stored in one of the flag registers corresponding to the lower-positional word memories, if a hit flag is stored in one of the flag registers corresponding to the upper-positional word memories, the upper-side mask circuit 33 shown in FIG. 1 masks that information, and transmits, to the priority encoder 35, the information for the lower-positional word memories prior to the other information.

A hit flag stored in each of the flag registers 13a to 13n shown in FIG. 1 is reset (the low level is stored) after the priority encoder 35 outputs the address of the word memory corresponding to the flag register.

In other words, among the flag registers corresponding to the lower-positional word memories, flag registers storing hit flags are all reset after the priority encoder 35 outputs all the addresses of the word memories corresponding to the flag registers storing hit flags. Accordingly, at this time, the lower-side hit-detection signal S1 is in low level. Thus, when a hit flag is stored in one of the flag registers corresponding to the upper-positional word memories, information for these word memories is transmitted to from the upper-side mask circuit 33 to the priority encoder 35.

Next, referring back to FIG. 1, the detection circuit 34 is described below.

The detection circuit 34 in FIG. 1 detects storage or no storage of a hit flag in one of the flag registers corresponding to lower-positional word memories which include the first prior word memory set by the first prior word-memory setting section 31 and word memories having lower positions compared with the first prior word memory in fixed priority order in the priority encoder 35. The detection circuit 34 includes a plurality of detection units 34a, 34b, ..., 34n respectively provided for the word memories 11a to 11n, and an inverter 34o. The second output signal So2 (see FIG. 2) is input to each detection unit from the logic circuit corresponding to the word memory. The detection units 34a to 34n are identical in circuit configuration to one another. Here, by using the detection unit 34m corresponding to the word memory 11m for an example, the circuit configuration is described below.

The detection unit 34m in FIG. 1 consists of first and second N-ch transistors 34m_1 and 34m_2 connected in series to each other, which are disposed between the input terminal of the inverter 34o and the ground GND. The gate of the N-ch transistor 34b_1 is connected to a third control signal input terminal 34p. A third signal S3 is input to the third control signal input terminal 34p. A second output signal So2 is input from the logic circuit 33m to the gate of the second N-ch transistor 34m_2.

The detection unit 34m operates in the following manner after searching. First, before priority operation starts, third control signal S3 in low level have been supplied to the gates of first N-ch transistors in all detection units 34a to 34n, fourth control signal S4 in low level have been supplied to the gate of P-ch transistor 34q. Therefore, the input terminal of the inverter 34o have been in high level by pre-charging via P-ch transistor 34q which is on-state. Next, on starting the priority operation, the third and fourth control signals S3, S4 are both set in high level. Then, the potential of the input terminal of the inverter 34o remains in high level if all second N-ch transistors are in off-state, and lower-side hit detection signal SI in low level is output from the inverter 34o to the upper-side mask circuit 33.

At this time, when the word memory 11m is one of the lower-positional word memories by the division of the division circuit 32, and a hit flag is stored in the flag register 13b, the second output signal So2 output from the logic circuit 33b is in high level. The second output signal So2 in high level is input to the gate of the second N-ch transistor 34m_2, so that the second N-channel transistor 34m_2 is turned on. As a result, the input terminal of the inverter 34o is connected to the ground GND, and its potential is in low level, so that the lower-side hit-detection signal S1 is in high level from the inverter 34o.

As described above, in the detection circuit 34, when a hit flag is stored in one of the flag registers corresponding to the above lower-positional word memories, the lower-side hit-detection signal S1 is output in high level from the output terminal of the inverter 34o to all the logic circuits 33a to 33n, while, when any hit flag is not stored in any of the lower-positional flag registers, the lower-side hit-detection signal S1 is output in low level from the output terminal of the inverter 34o.

As described above, in the priority circuit 30, the first prior word-memory setting section 31 sets a first prior word memory from among the word memories 11a to 11n, the division circuit 32 divides the word memories 11a to 11n into lower-positional word memories which include the first prior word memory, and which have lower positions compared with the first prior word memory in the fixed priority order in the priority encoder 35, and upper-positional word memories having upper positions compared with the first prior word memory, and, when a hit flag is stored in one of the flag registers corresponding to the lower-positional word memories, the addresses of the lower-positional word memories are output prior to the addresses of the other word memories.

Figure 3:
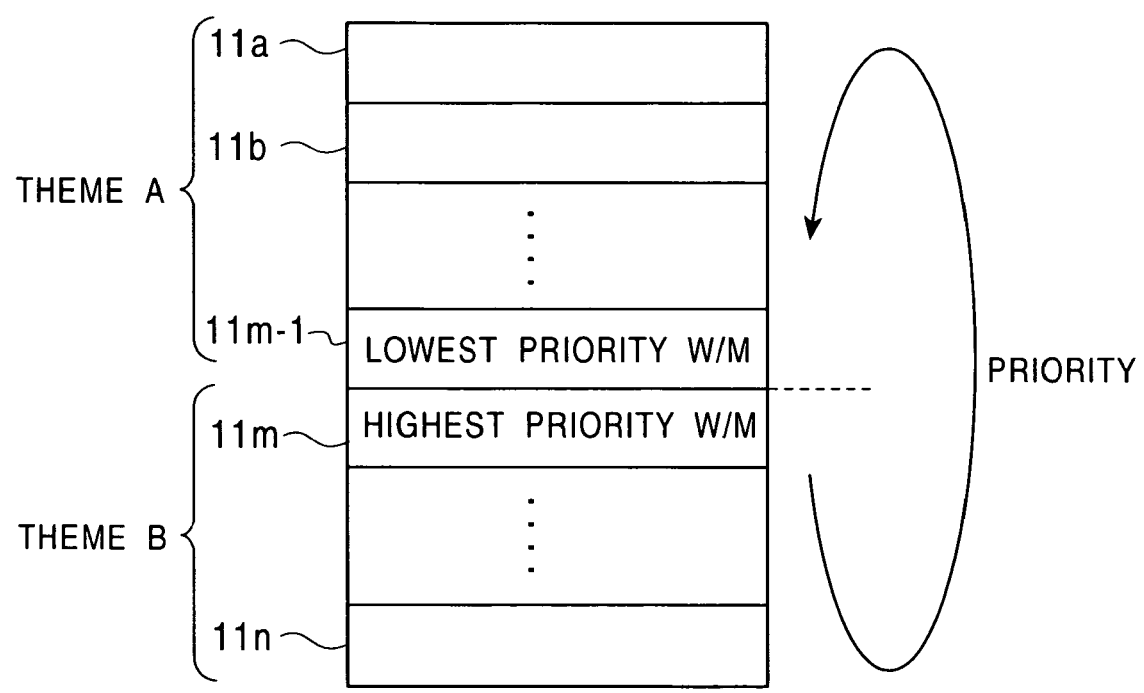
FIG. 3 is a schematic illustration of the priority levels of a plurality of word memories in the CAM shown in FIG. 1.

FIG. 3 is a schematic illustration of the priority levels of the word memories 11a to 11n in the CAM 20 in FIG. 1.

Among the word memories 11a to 11m−1, and 11m to 11n, the word memory 11m is the first prior word memory set by the first prior word-memory setting section 31 in FIG. 1.

As described above, in the first embodiment, the fixed priority order in the priority encoder 35 in FIG. 1 have descending order as indicated by the subscripted alphabetical letters of the reference numerals denoting the word memories 11a to 11m−1, and 11m to 11n.

Accordingly, the word memories 11a to 11m−1, and 11m to 11n, shown in FIG. 3, are divided into lower-positional word memories 11m, ..., 11n which includes the above first prior word memory 11m, and which have lower positions compared with the first prior word memory 11m, and upper-positional word memories 11a, 11b, ..., 11m−1 which have upper positions compared with the first prior word memory 11m.

The priority levels of the lower-positional word memories 11m, ..., 11n, and the priority levels of the upper-positional word memories 11a, 11b, ..., 11m−1 follow the fixed priority order in the priority encoder 35. Accordingly, the word memory 11m has the highest priority level, and the subsequent priority levels have descending order as indicated by the subscripted alphabetical letters of the reference numerals. The word memory 11a follows the word memory 11n, and the subsequent priority levels have descending order up to 11m−1. The word memory 11m−1 has the lowest priority level.

Therefore, according to the first embodiment, for example, by storing data items of theme A in the word memories 11*a*, 11*b*, . . . , 11*m*−1, while storing data items of theme B in the word memories 11*m*, . . . , 11*n*, setting the word memory 11*m* as the first prior word memory, and subsequently searching the data items based on a predetermined search data item, among data items matching the search data item, a search result for theme B can be obtained prior to the other results.

In the first embodiment, as the fixed priority order set in the priority encoder 35, priority levels having alphabetical descending order are used. However, the fixed priority order is not limited to this, but may have predetermined fixed order.

In addition, in the first embodiment, when hit flags are not stored in the flag registers corresponding to word memories which include the first prior word memory and which have lower positions compared with the first prior word memory, the priority circuit 30 can output the addresses of upper-positional word memories corresponding to flag registers which store hit flags. However, when it is not necessary to output the addresses of word memories in the upper-positional word memories, the configuration of the priority circuit 30 can be very simplified. In other words, the detection circuit 34 can be eliminated, and it is sufficient for, for example, the logic circuit 33*m* to have only the AND gate 33*m*_3, so that, instead of each signal So1, each signal So2 only needs to be supplied to the priority encoder 35.

In the first embodiment, the latches 31*a* to 31*n* constituting the first prior word-memory setting section 31, and each division unit in the division circuit are used to generate each division signal Sn. However, by directly storing the division signal Sn in each latch, the division circuit can be eliminated. For example, in the first embodiment, by storing "0" in a latch corresponding to the first prior word memory, and storing "1" in each of the other latches, division signals Sn are generated. However, from beginning, "0" can be stored in each latch having an upper position compared with the first prior word memory, and "1" can be stored in the other latches.

Next, a second embodiment of the present invention is described below.

Figure 4:
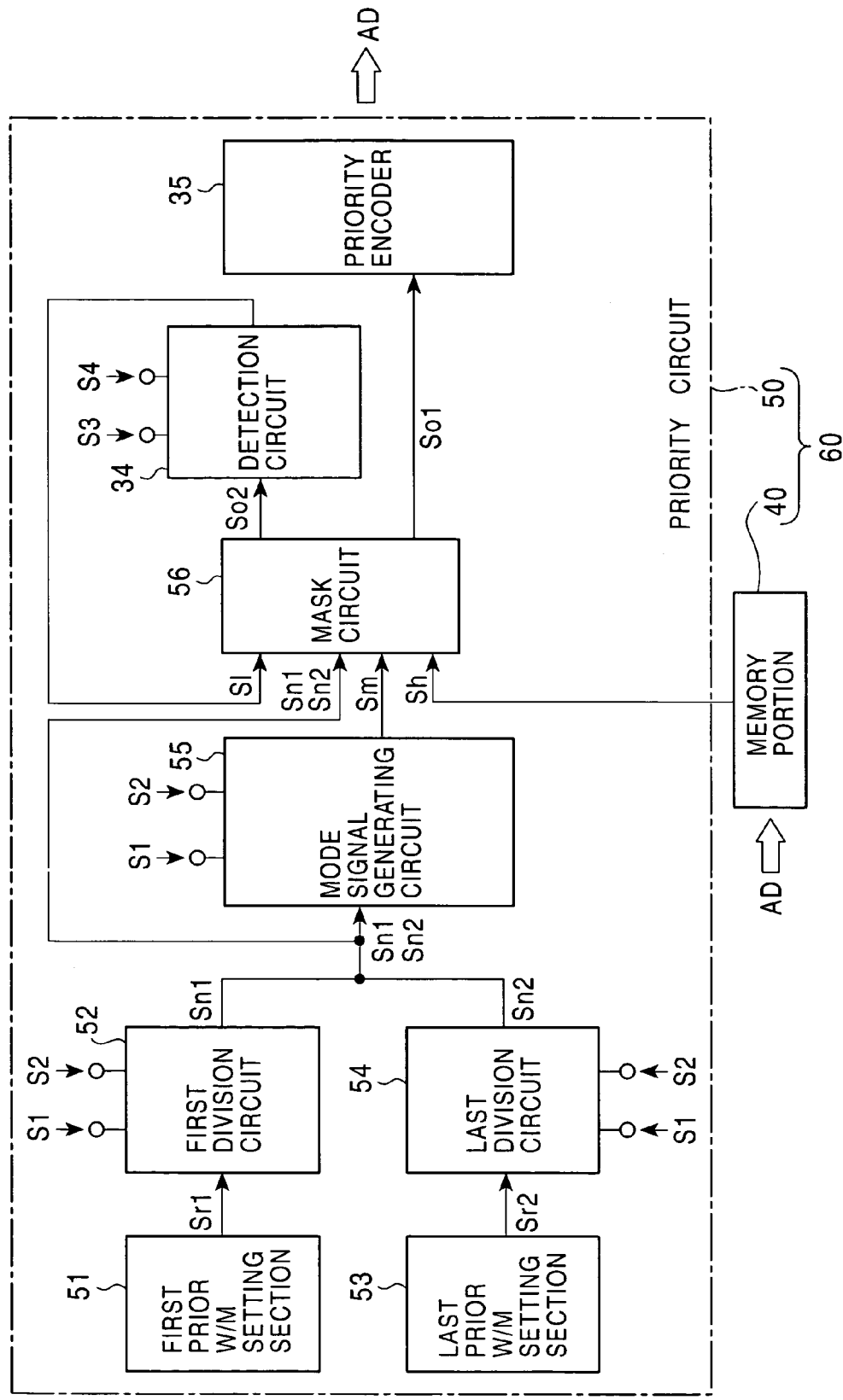
FIG. 4 is a block diagram showing a CAM according to a second embodiment of the present invention.

FIG. 4 is a block diagram showing a CAM 60 according to a second embodiment of the present invention.

In FIG. 4, components identical to those described with reference to FIG. 1 are denoted by identical reference numerals. Accordingly, a detailed description thereof is omitted.

The CAM 60 consists of a priority circuit 50 and a memory portion 40. The priority circuit 50 includes a first prior word-memory setting section 51, a first division circuit 52, a last prior word-memory setting section 53, a last division circuit 54, a mode signal generating circuit 55, a mask circuit 56, a detection circuit 34, and a priority encoder 35.

The first prior word-memory setting section 51 sets, from among a plurality of word memories in the memory portion 40, a word memory whose address is to be output prior to the addresses of the other word memories. The designated word memory is hereinafter referred to as the first prior word memory.

The first division circuit 52 divides the word memories in the memory portion 40 into lower-positional word memories compared with the first prior word memory in fixed order of priority in the priority encoder 35 and which include the first prior word memory, and upper-positional word memories compared with the first prior word memory.

The last prior word-memory setting section 53 sets, from among the word memories in the memory portion 40, a word memory whose address is to be last output. This word memory is hereinafter referred to as the last prior word memory.

The last division circuit 54 divides the word memories in the memory portion 40 into word memories which have upper positions compared with the last prior word memory in the fixed order of priority in the priority encoder 35 and which include the last prior word memory, and word memories having lower positions compared with the last prior word memory.

In the memory portion 40, a memory area composed of the word memories is divided into an effective region in which, when a data item in one word memory matches search data in a search mode, the address of the word memory is output, and a non-effective region other than the effective region which is composed of non-effective word memories. A way of dividing the memory area into the effective region and the non-effective region has the following two types depending on which words are respectively designated as the first prior word memory and the last prior word memory.

Figure 5:
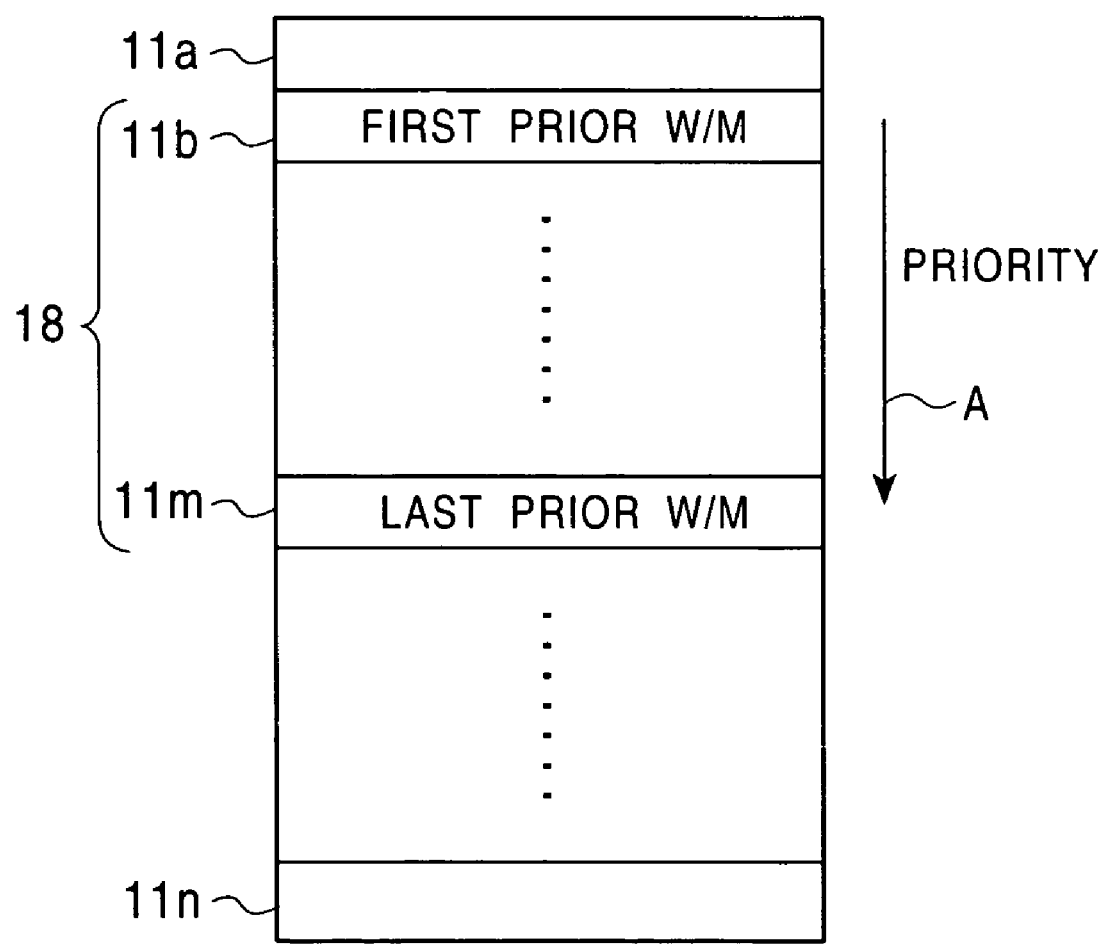
FIG. 5 is a schematic illustration of a memory area divided into one effective region and two non-effective regions in the second embodiment.
Figure 6:
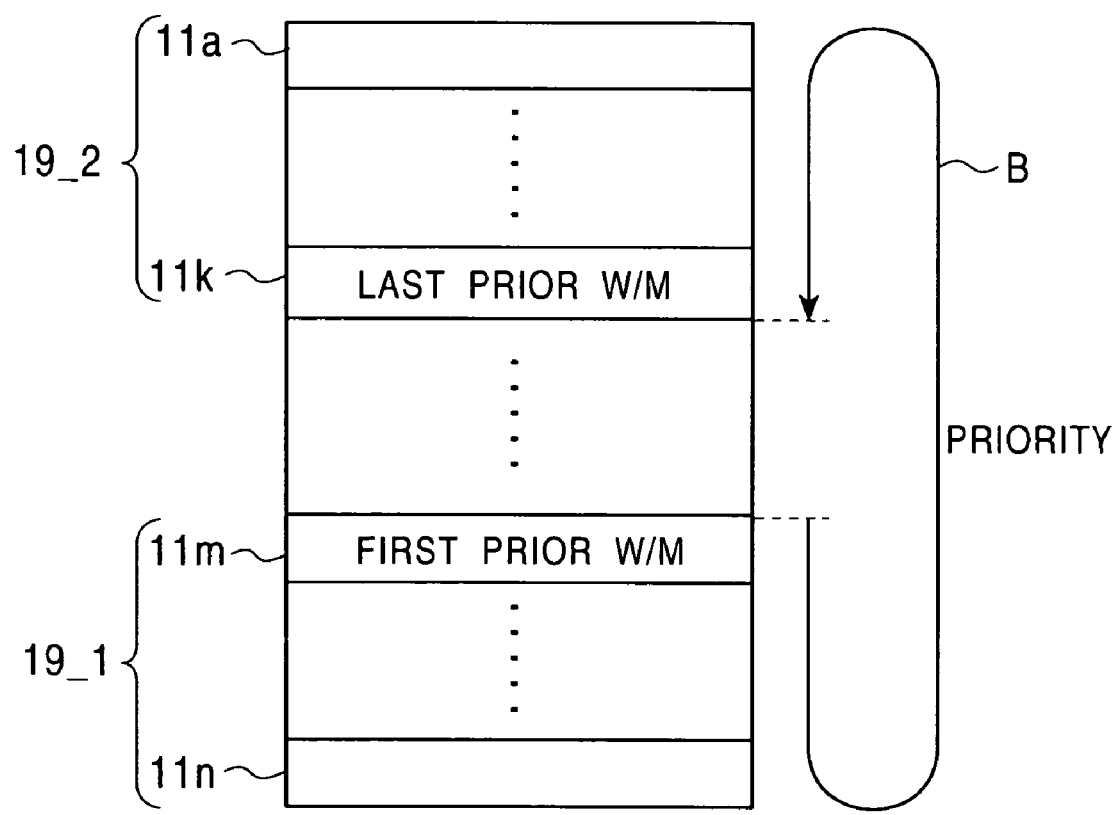
FIG. 6 is a schematic illustration of a memory area divided into two effective regions and one non-effective region.

FIG. 5 is a schematic illustration of a memory area divided into one effective region and two non-effective regions. FIG. 6 is a schematic illustration of a memory area divided into two effective regions and one non-effective region. Also, in the second embodiment, fixed priority order in the priority encoder 35 in FIG. 4 have descending order as indicating by subscripted alphabetical letters of reference numerals denoting the word memories shown in FIGS. 5 and 6.

In the example shown in FIG. 5, the word memory 11*m* which has a lower position than the word memory 11*b* designated as the first prior word memory is designated as the last prior word memory. In this case, the effective region 18 shown in FIG. 5 consists of the first prior word memory 11*b* to the last prior word memory 11*m*.

In the example shown in FIG. 6, the word memory 11*k* which has an upper position than the word memory 11*m* designated as the first prior word memory, is designated as the last prior word memory. In this case, an effective region 19_1 consists of the first prior word memory 11*m* to the bottom word memory 11*n*, and an effective region 19_2 consists of the top-positional word memory 11*a* to the last prior word memory 11*k*.

Based on division signals Sn1 and sn2, the mode signal generating circuit 55 determines which word memory is higher in priority between the first prior word memory and the last prior word memory, and outputs a mode signal Sm representing the result of the determination. In the second embodiment, the mode signal generating circuit 55 determines in which of the above two types effective region setting is performed. Masking in accordance with the result of the determination is executed by the mask circuit 56.

The mask circuit 56 performs the following masking on hit flags in a plurality of flag registers 13*a* to 13*n* (see FIG. 1) in the memory portion 40 in response to the positional relationship (represented by the above mode signal Sm) between the first prior word memory and the last prior word memory.

Specifically, as shown in FIG. 5, when the first prior word memory has an upper position than the last prior word memory, hit flags corresponding to the word memories which do not belong to the effective region 18 are masked. Conversely, as shown in FIG. 6, in a case in which the first prior word memory has a lower position than the last prior word memory, when the effective region 19_1 includes a word memory storing a data item matching the search data, hit flags corresponding to word memories having upper positions than the first prior word memory are masked, while, when the effective region 19_1 does not include a word memory storing a data item matching the search data, flag registers corresponding to word memories having lower positions than the last prior word memory are masked.

Regarding each of word memories in effective regions, the first output signal So1 is output in high level from the mask circuit 56 to the priority encoder 35, while, for a word memory in which the corresponding flag register does not store a hit flag, the first output signal So1 is low level from the mask circuit 56 to the priority encoder 35. In addition, for word memories which include the first prior word memory and which have lower positions than the first prior word memory, with hit flags stored in the corresponding flag registers, the second output signal So2 is output in high level to the detection circuit 34. For the other word memories, the second output signal So2 is output in low level to the detection circuit 34.

The detection circuit 34 outputs, to the mask circuit 56, a hit-detection signal S1 which is in low level only if all the second output signals So2 output for each word memory from the mask circuit 56 are in low level.

The priority encoder 35 outputs the addresses of word memories corresponding to the first output signal So1 in high level, in fixed order of priority.

Figure 7:
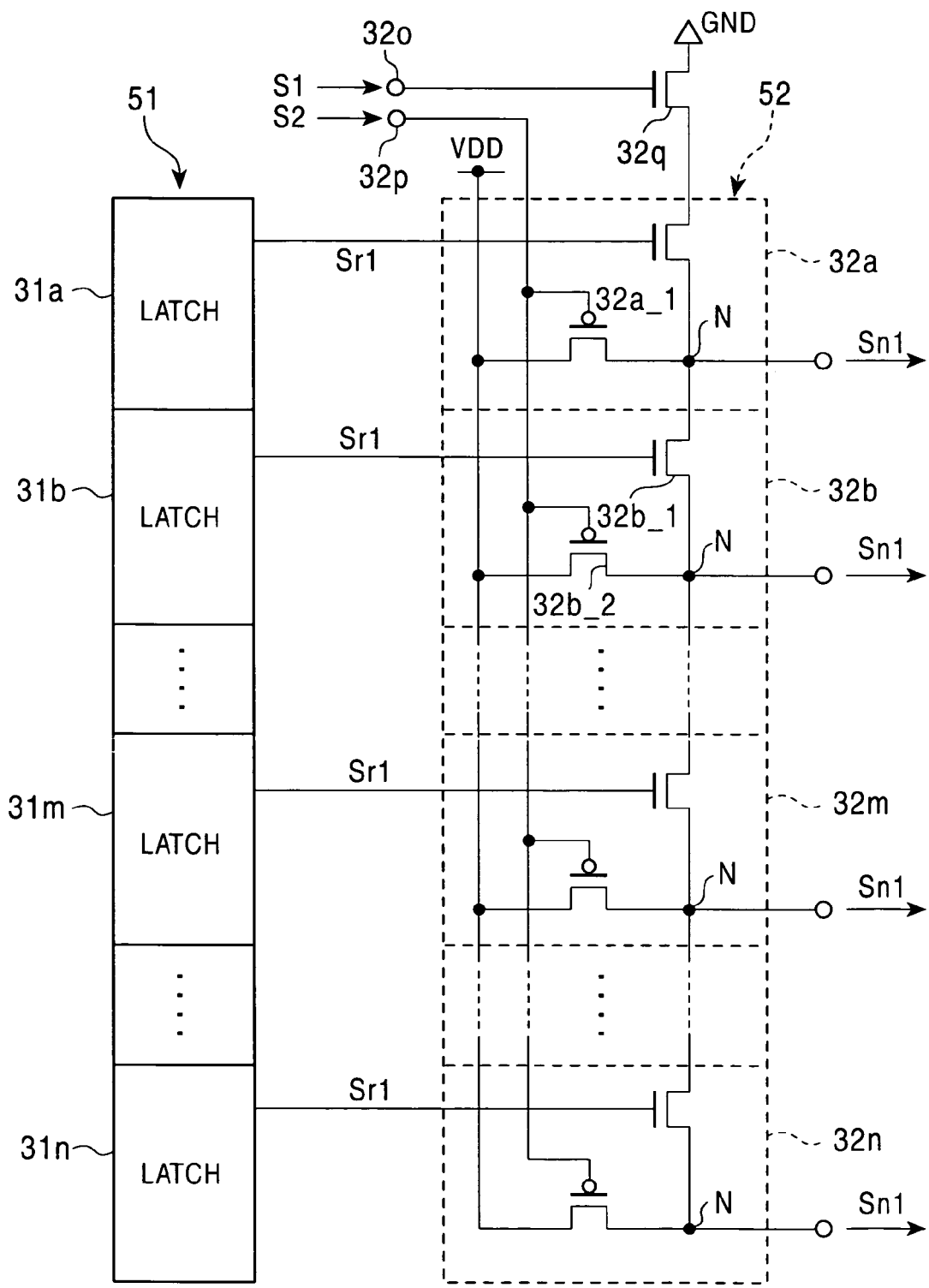
FIG. 7 is a circuit diagram showing the first prior word-memory setting section and first division circuit shown in FIG. 4.

FIG. 7 is a circuit diagram showing the first prior word-memory setting section 51 and first division circuit 52 shown in FIG. 4. Since they are same in configuration to the first prior word-memory setting section 31 and division circuit 32 shown in FIG. 1, a description of their operations is omitted.

Figure 8:
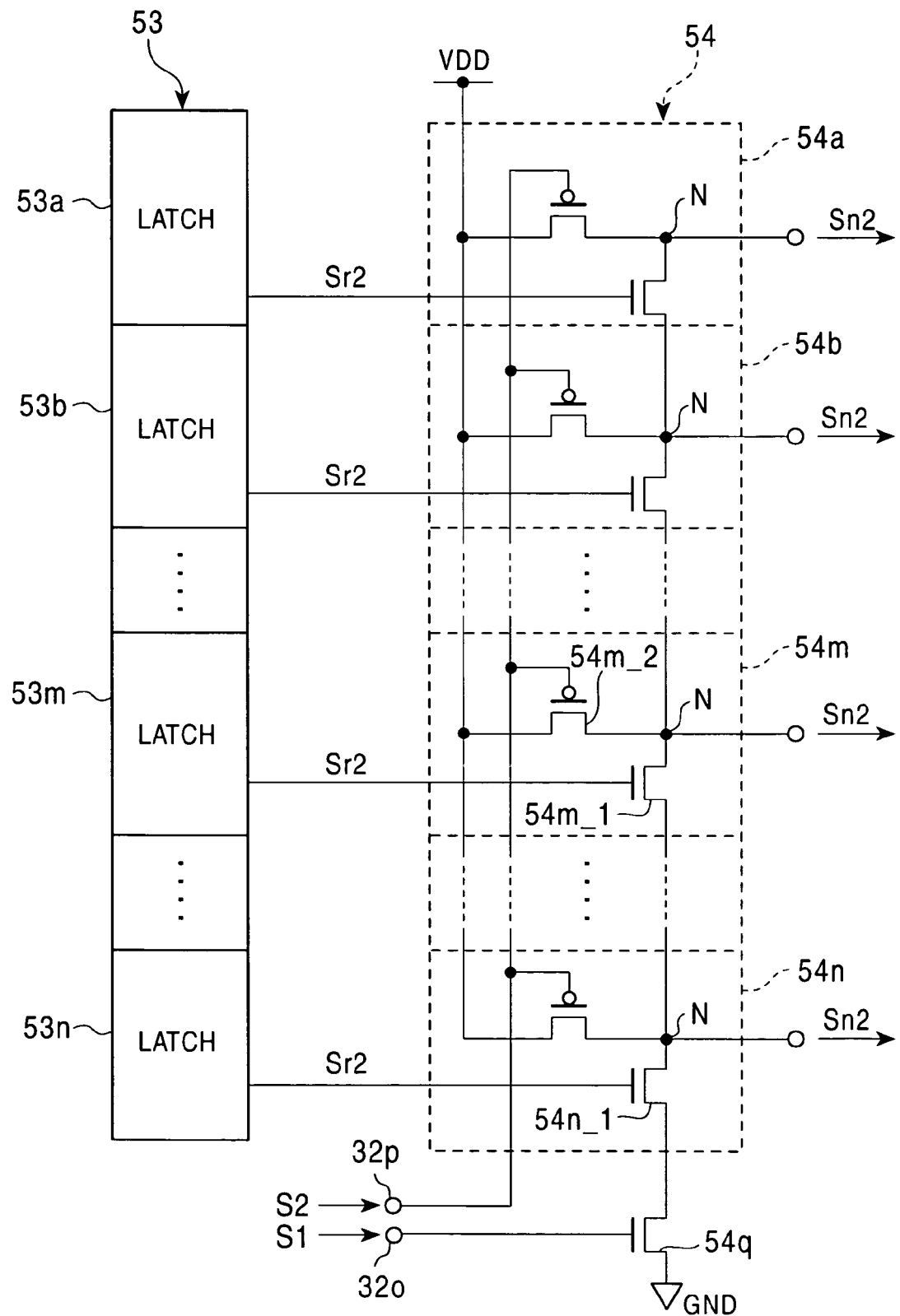
FIG. 8 is a circuit diagram showing the last prior word-memory setting section and last division circuit shown in FIG. 4.

FIG. 8 is a circuit diagram showing the last prior word-memory setting section 53 and last division circuit 54 shown in FIG. 4.

The last prior word-memory setting section 53 consists of a plurality of latches 53a, 53b, . . . , 53n corresponding to the word memories, respectively. The last division circuit 54 has a plurality of division units 54a, 54b, . . . , 54n which are identical in circuit configuration to one another, and an N-ch transistor 54q.

The latches 53a to 53n store high levels in initial state. When the user sets the last prior word memory, a latch corresponding to the word memory stores a low level. Latch signals Sr2 are output from the latches 53a to 53n to corresponding division units 54a, . . . , 54n.

In the second embodiment, when the user sets, for example, the word memory 11m (see FIG. 5) as the last prior word memory, the latch 53m stores a low level. Then, division signals Sn2 are output in high level from nodes N of the division units 54a to 54m, while division signals Sn2 are output in low level from nodes N of division units 54m+1 (not shown), . . . , 54n.

Figure 9:
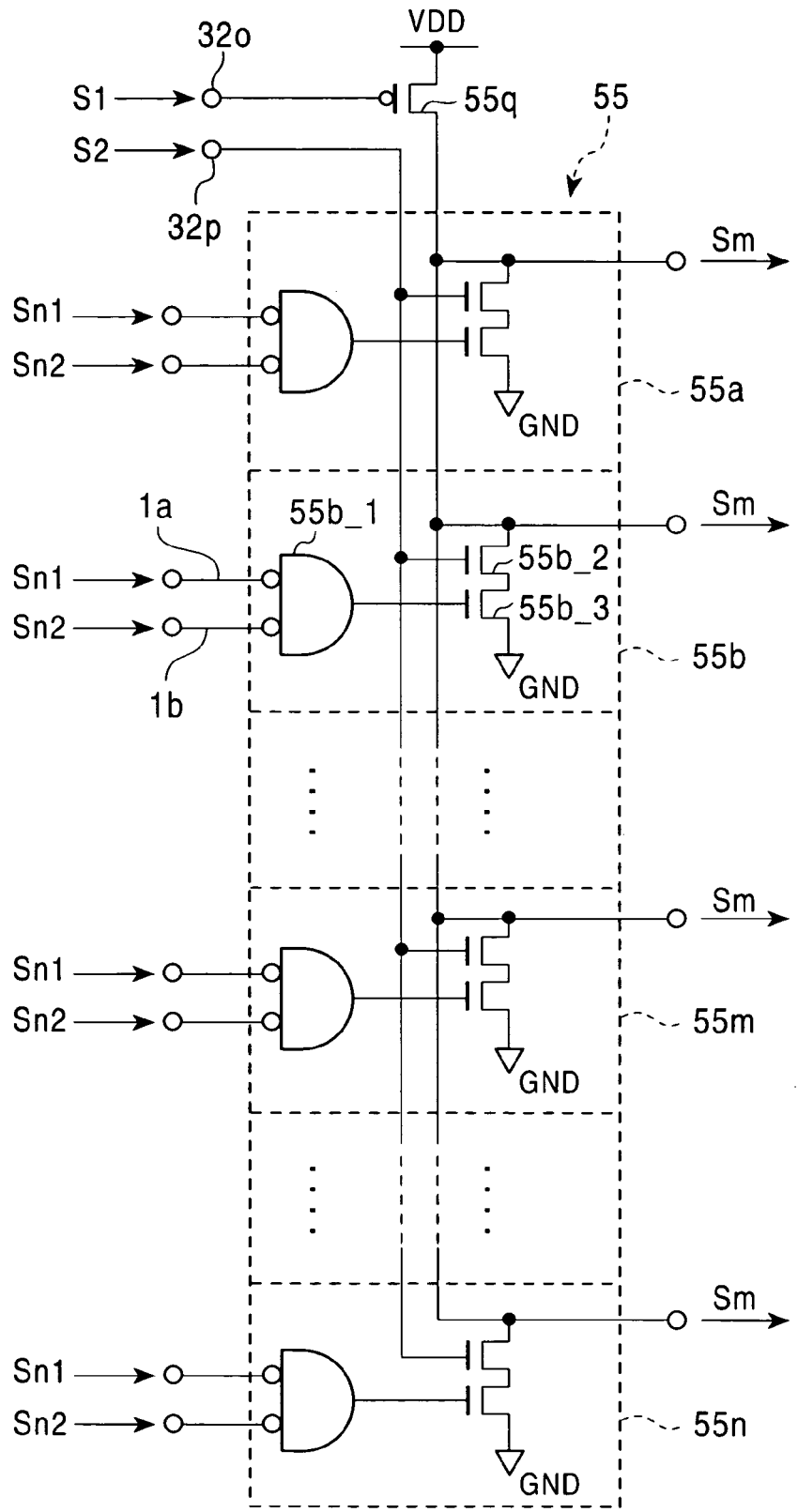
FIG. 9 is a circuit diagram showing the mode signal generating circuit shown in FIG. 4.

FIG. 9 is a circuit diagram showing the mode signal generating circuit 55 shown in FIG. 4.

The mode signal generating circuit 55 consists of a P-ch transistor 55q and a plurality of unit circuits 55a, 55b, . . . , 55n corresponding to the word memories, respectively. The unit circuits 55a to 55n are same in circuit configuration to one another. As an example, the unit circuit 55b corresponding to the word memory 11b is described below.

The unit circuit 55b consists of a NOR gate 55b_1, first N-ch transistor 55b_2, and second N-ch transistor 55b_3. The NOR gate 55b_1 receives the division signals Sn1 and Sn2, and its output terminal is connected to the gate of the second N-ch transistor 55b_3. Two N-ch transistors 55b_2 and 55b_3 are serially connected, and a source of the N-ch transistor 55b_3 is connected to the ground GND. The drains of the first N-ch transistors in all unit circuits 55a to 55n are commonly connected, and they are also connected to a source of P-ch transistor 55q. The source of the P-ch transistor 55q is connected to power supply VDD, and the gate of the P-ch transistor 55q receives first control signal S1. The potential of the drain of first N-ch transistor is output as a mode signal Sm to the mask circuit 56, which is described later.

First and second control signals S1,S2 are both in low level before the setting of first prior word memory and last prior word memory, and they turn to high level after the setting is performed.

Assuming that both division signals Sn1 and Sn2 are in low level, the output of the NOR gate 55b_1 is in high level, thus turning on the N-ch transistor 55b_3. Thus, the mode signal Sm is in low level. Conversely, if one of the division signals Sn1 and Sn2 is in high level, the mode signal Sm is in high level.

In the first N-ch transistors of all the unit circuits 55a to 55n, their drains are connected in common to one another. Accordingly, when even one of the second N-ch transistors is in on-state, in other words, when there is even one unit circuit which receives the division signals Sn1 and Sn2 both in low level, the mode signals Sm are output in low level from all the unit circuits 55a to 55n. Also, when each of the unit circuits 55a to 55n receives the division signals Sn1 and Sn2, with at least one division signal being in high level, all the unit circuits 55a to 55n output the mode signals Sm in high level.

As described above, the division signal Sn1 is in low level for word memories having upper positions compared with the first prior word memory, while it is in high level for word memories including the first prior word memory and having lower positions compared with the first prior word memory. In addition, the division signal Sn2 is in high level for word memories including the last prior word memory and having upper positions compared with the last prior word memory, while it is in low level for word memories having lower positions compared with the last prior word memory.

When a word memory having a lower position compared with the last prior word memory is set as the first prior word memory, the word memories 11a to 11n include a word memory having a lower positions compared with the last prior word memory and having a upper position compared with the first prior word memory. For such a word memory, both division signals Sn1 and Sn2 are in low level. Conversely, when a word memory having a upper position compared with the last prior word memory is set as the first prior word memory, for any word memory, one of both division signals Sn1 and Sn2 is in high level.

As a result, the mode signals Sm output from the unit circuits 55a to 55n are all in high level when the first prior word memory has a upper position compared with the last prior word memory, while they are all in low level when the first prior word memory has a lower position compared with the last prior word memory. The above-described mode signals Sm are output to the mask circuit 56.

Figure 10:
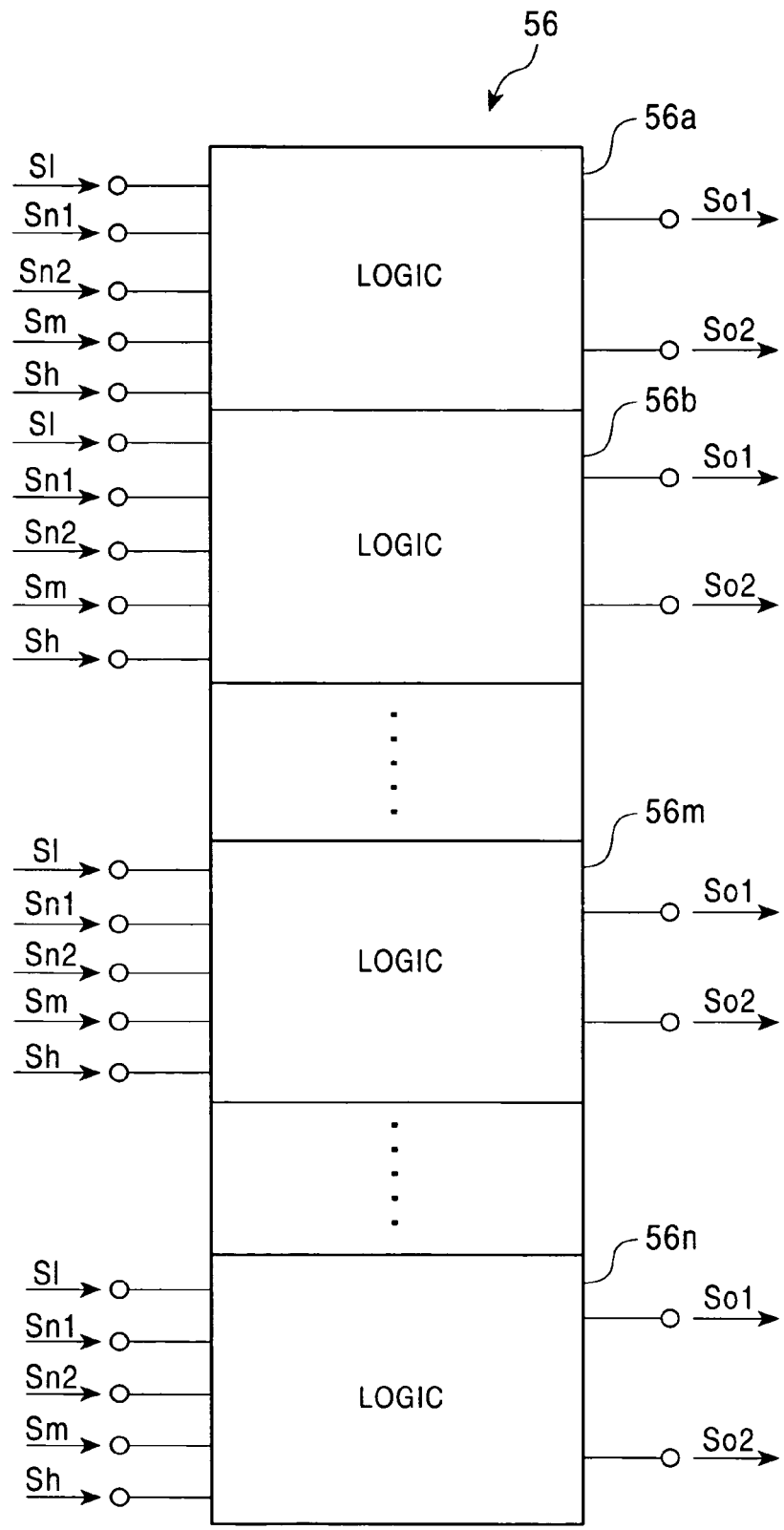
FIG. 10 is a circuit diagram showing the mask circuit shown in FIG. 4.

FIG. 10 is a block diagram showing the mask circuit 56 shown in FIG. 4.

The mask circuit 56 consists of a plurality of logic circuits 56a, 56b, . . . , 56n which respectively correspond to the word memories, and which are identical in circuit configuration to one another. In addition to the above division signals Sn1 and Sn2, and the mode signal Sm, the lower hit signal S1 output from the detection circuit 34, and the match/mismatch signal (hit signal) Sh output from the flag register are input to each logic circuit. As an example, the logic circuit 56b is described below.

Figure 11:
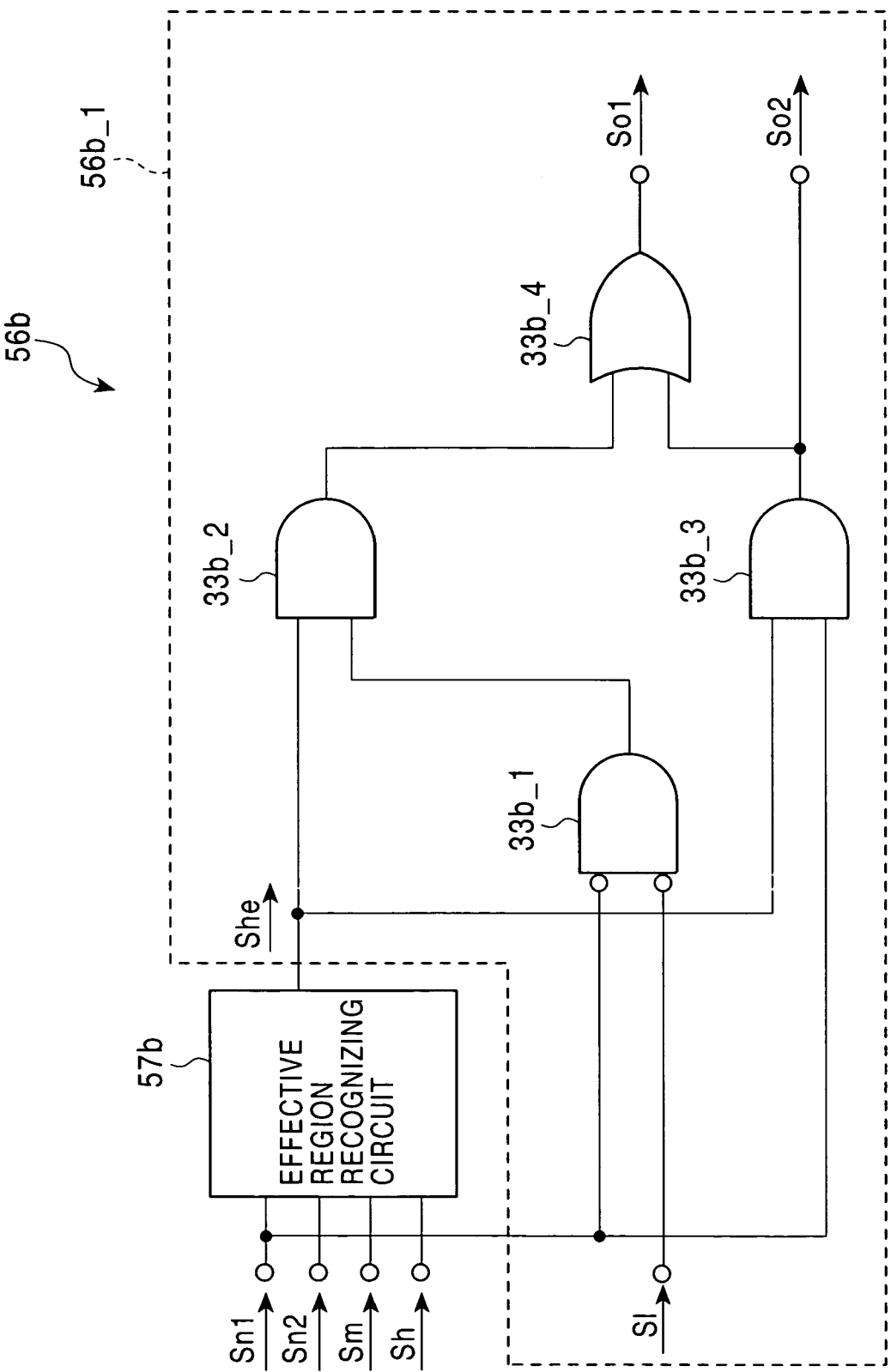
FIG. 11 is a circuit diagram showing the logic circuit shown in FIG. 10.

FIG. 11 is a circuit diagram showing the logic circuit 56b shown in FIG. 10.

The logic circuit 56b includes an effective region recognizing circuit 57b, a NOR gate 33b_1, two AND gates 33b_2 and 33b_3, and an OR gate 33b_4. A circuit portion 56b_1 constituted by the NOR gate 33b_1, the two AND gates 33b_2 and 33b_3, and the OR gate 33b_4 is equivalent to the logic circuit 33b in the first embodiment. Accordingly, a detailed description of the circuit portion 56b_1 is omitted.

In the effective region recognizing circuit 57b, when a flag register stores a hit flag (when the hit signal Sh is in high level), it is determined whether the corresponding word memory is an effective word memory whose address is to be output. When the corresponding word memory is effective, an effective match signal She is output in high level. Conversely, when the flag register stores no hit flag (when the hit signal is in low level), and when the corresponding word memory is non-effective even if a hit flag is stored, the effective match signal She is output in low level.

For example, when one effective region 18 is set as shown in FIG. 5, the effective region recognizing circuit 57b determines that the corresponding word memory 11b is an effective word memory, since it belongs to the effective region 18. Also, as shown in FIG. 6, when two effective regions 19_1 and 19_2 are set, it is determined that the corresponding word memory 11b is an effective word memory since it belongs to the effective region 19_2 shown in FIG. 6.

Figure 12:
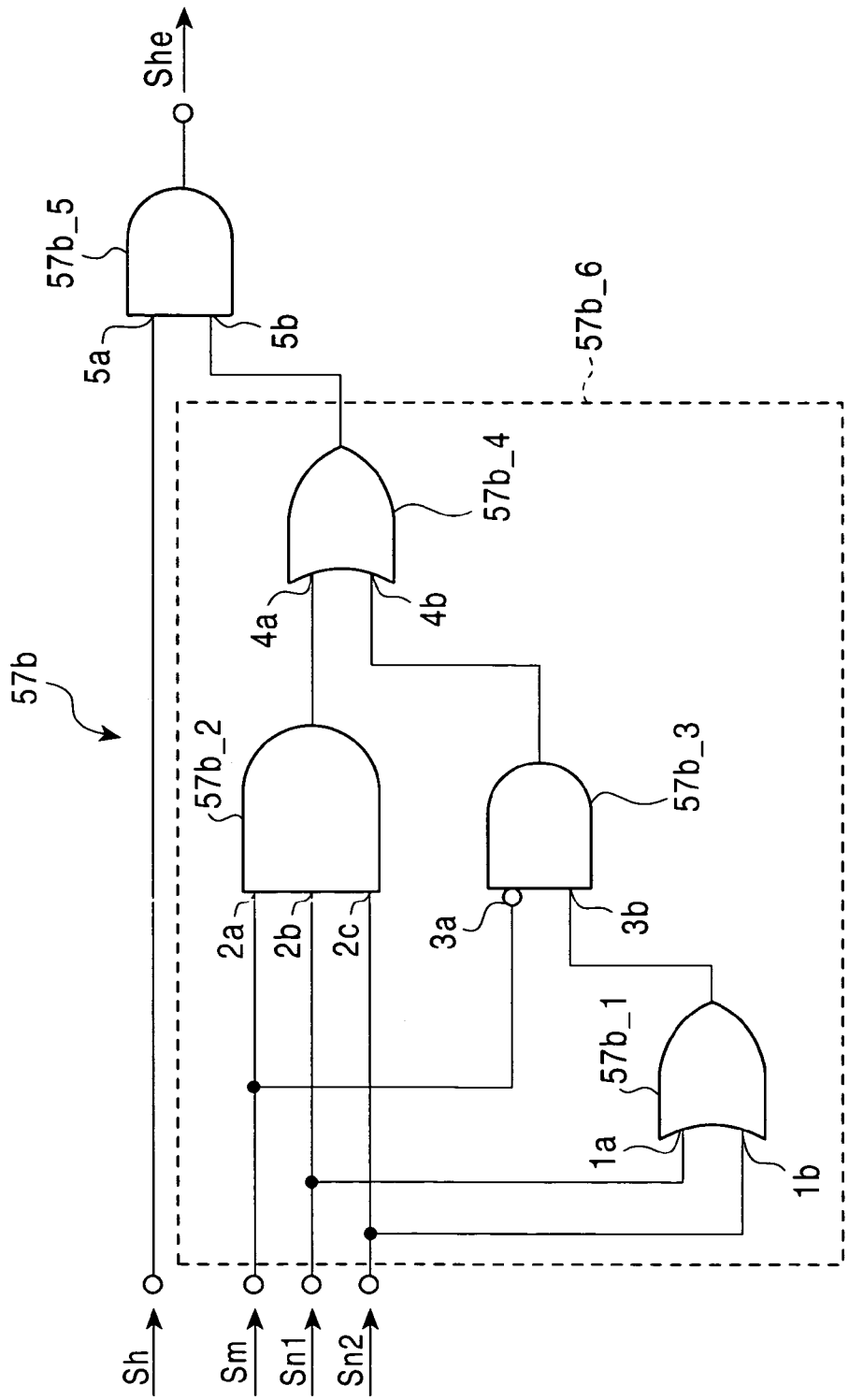
FIG. 12 is a circuit diagram showing the effective region recognizing circuit shown in FIG. 11.

FIG. 12 is a circuit diagram showing the effective region recognizing circuit 57b shown in FIG. 11.

The effective region recognizing circuit 57b consists of two OR gates 57b_1, 57b_4, and three AND gate, 57b_2, 57b_3, and 57b_5.

The division signals Sn1 and Sn2 are input to the OR gate 57b_1.

The mode signal Sm, and the division signals Sn1 and Sn2 are input to three input terminals of the first AND gate 57b_2, respectively.

The mode signal Sm and an output signal from the OR gate 57b_1 are input to two input terminals of the AND gate 57b_3, respectively.

An output signal from the AND gate 57b_2 and an output signal from the AND gate 57b_3 are input to two input terminals of the OR gate 57b_4, respectively.

The match detection signal Sh and an output signal from the OR gate 57b_4 are input to two input terminals of the AND gate 57b_5, respectively. The above effective match signal She is output from an output terminal of the AND gate 57b_5.

In the circuit portion 57b_6 surrounded by the broken line shown in FIG. 12, based on the mode signal Sm, and the division signals Sn1 and Sn2, it is determined whether the corresponding word memory is an effective word memory whose address is to be output. When the corresponding word memory is an effective word memory, a high level is output from an output terminal of the OR gate 57b_4.

For example, when one effective region 18 is set as shown in FIG. 5, the above determination is executed in the following manner. In this case, at least one of the division signals Sn1 and Sn2 is in high level. Then, the above mode signal Sm is in high level. Here, the word memory 11b is identical to the first prior word memory 11b and has an upper position than the last prior word memory 11m. Thus, the division signals Sn1 and Sn2 corresponding to the word memory 11b are both in high level.

As shown in FIG. 6, when two effective regions 19_1 and 19_2 are set, the above mode signal Sm is in low level since at least one unit circuit in the mode signal generating circuit 55 receives division signal Sn1 and Sn2 which are both in low level. At this time, regarding to the two effective regions 19_1 and 19_2, word memories belonging to the first effective region 19_1 include the first prior word memory 11m and have lower positions compared with the first prior word memory 11m, so that the division signal Sn1 is in high level and the division signal Sn2 is in low level. In addition, word memories belonging to the second effective region 19_2 have upper positions compared with the first prior word memory 11m, and include the last prior word memory 11k and upper positions compared with the last prior word memory 11k. Thus, the division signal Sn1 is in low level, and the division signal Sn2 is in high level. Here, the word memory 11b corresponding to the effective region recognizing circuit 57b in FIG. 12 is a word memory belonging to the second effective region 19_2 in FIG. 6. Thus, the division signal Sn1 is in low level, and the division signal Sn2 is in high level.

As described above, when the mode signal Sm, and the division signals Sn1 and Sn2 are all in high level, or the mode signal Sm is in high level and either division signal Sn1 or Sn2 is in high level, a high level is output from the output terminal of the OR gate 57b_4.

The effective region recognizing circuit 57b in FIG. 12 outputs the She in high level when the corresponding word memory 11b belongs to the above effective region and the flag register 13b corresponding to the word memory 11b stores a hit flag (when the hit signal Sh is in high level).

Next, the operation of the mask circuit 56 constituted by the logic circuits 56a to 56n, in which the logic circuit 56b is shown as a example, is described below with reference to FIGS. 5 and 6.

As shown in FIG. 5, in a case in which one effective region 18 is set, for word memories other than the word memories belonging to the effective region 18, each effective region recognizing circuit outputs the She in low level, whereby, even if hit flags are stored in flag registers corresponding to the word memories, the hit flags are masked. For the word memories belonging to the effective region 18, the circuit portion (see the circuit portion 56b_1 shown in FIG. 11) of the logic circuit excluding each effective region recognizing circuit performs processing equivalent to that of the logic circuit 33b (in FIG. 1) in the first embodiment. Thus, when flag registers corresponding to the word memories belonging to the effective region 18 include those which store hit flags, the hit flags are sent to the priority encoder 35 without being changed. The addresses of the word memories corresponding to the hit flags are output in order of priority indicated by the arrow A, from the first prior word memory 11b up to the last prior word memory 11m.

In addition, when two effective regions 19_1 and 19_2 are set as shown in FIG. 6, hit flags corresponding to word memories which don't belong to the effective regions 19_1 and 19_2 are masked. Thus, when a hit flag is stored in a flag register corresponding to one of the word memories belonging to the first effective region 19_1, hit flags corresponding to the word memories belonging to the second effective region 19_2 are masked. The flag register is reset when the address of the word memory is output from the priority encoder 35. Thus, flag registers which store hit flags, which correspond to the word memories belonging to the first effective region 19_1, are reset after the hit flags are sent to the priority encoder 35 and the priority encoder 35 outputs the addresses of word memories corresponding to the hit flags. After that, masking of the hit flags corresponding to the word memories belonging to the second effective region 19_2 is cancelled, and the hit flags are sent to the priority encoder 35. The priority encoder 35 outputs the addresses of the word memories corresponding to the hit flags. In this processing executed in the mask circuit 56, the addresses of the word memories which correspond to the flag registers storing the hit flags and which belong to the first and second effective regions 19_1 and 19_2 are output in order of priority indicated by the arrow B, from the first prior word memory 11m up to the last prior word memory 11k through the bottom-positional word memory 11n and the top-positional word memory 11a.

According to the CAM 60 described with reference to FIGS. 4 to 12, among the word memories 11a to 11n in the memory portion 40, an effective region can be designated. Only for the word memories within the effective region, the address of a word memory storing a data item matching search data can be obtained. As a result, a group of word memories to be searched can be specified, thus increasing the efficiency of searching.

Although the foregoing embodiments describe a case in which priority levels having descending alphabetical order are shown as fixed order of priority set in the priority encoder 35, the fixed order of priority is not limited to the priority levels, but may be other fixed order of priority.

As described above, according to each CAM of the present invention, in searching data items stored by theme, the management of the stored data items and search results is facilitated, so that a search result for a desired theme can be output prior to the search results for other themes, while suppressing a decrease in throughput.

What is claimed is:

1. A content addressable memory comprising:
   a plurality of word memories which respectively have assigned addresses, and each outputs a match/mismatch signal representing storage or no storage of a data item matching search data, in a search mode; and
   a priority circuit for changing the priority of the addresses which are to be output prior to the other addresses, wherein said priority circuit comprises:
      a priority encoder for outputting the addresses of the word memories from which the match signals are transmitted to the priority encoder in the search mode, in a predetermined fixed priority order;
      a first prior word-memory setting section for setting a first prior word memory among said plurality of word memories; and
      a priority changing part for masking the match signals output from upper-positional word memories, which include the word memories having upper positions compared with the first prior word memory in the fixed priority order in said priority encoder, and for transmitting to the priority encoder signals representing that the upper-positional word memories output no match signals, while transmitting to said priority encoder the match signals output from lower-positional word memories which include the first prior word memory and the word memories having lower positions compared with the first prior word memory in the fixed priority order.

2. The content addressable memory according to claim 1, wherein said priority changing part comprises:
   a division circuit for dividing said plurality of word memories into the upper-positional word memories and the lower-positional word memories.

3. The content addressable memory according to claim 1, wherein said priority changing part masks the match signals output from the upper-positional word memories when the match signal is output from one of the lower-positional word memories transmits the match signals output from the upper-positional word memories to said priority encoder when no match signal is output from any one of the lower-positional word memories.

4. The content addressable memory according to claim 3, wherein:
   said priority changing part includes a division circuit for dividing said plurality of word memories into the upper-positional word memories and the lower-positional word memories.

5. The content addressable memory according to claim 3, wherein said priority changing part includes a detection circuit for detecting the match signals output from the lower-positional word memories:
   said priority changing part masks the match signals output from the upper-positional word memories when the detection circuit detects the match signal output from one of the lower-positional word memories; and
   said priority changing part transmits the match signals output from the upper-positional word memories to said priority encoder when the detection circuit detect no match signal output from any one of the lower-positional word memories.

6. A content addressable memory comprising:
   a plurality of word memories which respectively have assigned addresses, and each outputs a match/mismatch signal representing storage or no storage of a data item matching search data, in a search mode:
   a plurality of flag registers which respectively correspond to said plurality of word memories, and which stores the match/mismatch signals output from the corresponding word memories; and
   a priority circuit for changing the priority of the addresses which are to be output prior to the other addresses, wherein said priority circuit comprises:
   a priority encoder for outputting the addresses of the word memories from which the match signals are transmitted to the priority encoder in the search mode, in a predetermined fixed priority order;
   a first prior word-memory setting section for setting a first prior word memory among said plurality of word memories; and
   a priority changing part which, by masking the match signals output from upper-positional flag registers within said plurality of flag registers, which correspond to the word memories having upper positions compared with the first prior word memory in the fixed priority order in said priority encoder, transmits to said priority encoder signals representing that no match signals are stored in the upper-positional flag registers, while transmitting to said priority encoder the match signals output from lower-positional flag registers within said plurality of flag registers, which correspond to the first prior word memory and to the word memories having lower positions compared with the first prior word memory in the fixed priority order.

7. The content addressable memory according to claim 6, wherein:
   said priority changing part includes a division circuit for dividing said plurality of word memories into lower-positional word memories which correspond to the lower-positional flag registers, and upper-positional word memories which correspond to the upper-positional flag registers.

8. The content addressable memory according to claim 6, wherein said priority changing part masks the match signals output from the upper-positional flag registers and transmits to said priority encoder the signals representing that no match signals are stored in the upper-positional flag registers when the match signal is stored in one of the lower-positional flag registers and transmits to said priority encoder the match signals output from the upper-positional flag registers when no match signal is stored in any one of the lower-positional flag registers.

9. The content addressable memory according to claim 8, wherein:
said priority changing part includes a division circuit for dividing said plurality of word memories into lower-positional word memories which correspond to the lower-positional flag registers and upper-positional word memories which correspond to the upper-positional flag registers.

10. The content addressable memory according to claim 8, wherein:
said priority changing part includes a detection circuit for detecting the match signals output from the lower-positional flag registers
when said detection circuit detects the match signal output from at least one of the lower-positional flag registers, the match signals output from the upper-positional flag registers are masked; and
when said detection circuit detects no match signal output from any one of the lower-positional flag registers, the match signals output from the upper-positional flag registers are transmitted to said priority encoder.

11. The content addressable memory according to claim 8, wherein:
said first prior word-memory setting section comprises a plurality of latches respectively corresponding to the word memories; and
a mismatch value is stored in each of the latches which correspond to the word memories having upper positions compared with the first prior word memory in the fixed priority order, and a match value is stored in each of the latches which correspond to the first prior word memory and to the word memories having the lower positions compared with the first prior memory in the fixed priority order.

12. The content addressable memory according to claim 9, wherein:
said first prior word-memory setting section comprises a plurality of latches respectively corresponding to the word memories;
said division circuit generates division signals to be stored in the plurality of latches, each of the division signals to be stored in the latches corresponding to the upper-positional word memories having a mismatch value and each of the division signals to be stored in the latches corresponding to the lower-positional word memories having a match value; and
said priority changing part supplies said priority encoder with a signal representing the logical product of each of the division signals stored in the latches and the match/mismatch signal supplied from each of the flag register.

13. A content addressable memory comprising:
a plurality of word memories which respectively have assigned addresses, and each outputs a match/mismatch signal representing storage or no storage of a data item matching search data, in a search mode; and
a priority circuit for changing the priority of the addresses which are to be output prior to the other addresses, said priority circuit comprising:
a priority encoder for outputting the addresses of the word memories from which the match signals are transmitted to said priority encoder in the search mode, in a predetermined fixed priority order;
a first prior word-memory setting section for setting a first prior word memory among said plurality of word memories;
a last prior word-memory setting section for setting a last prior word memory among said plurality of word memories; and
a priority changing part wherein:
(i) when the first prior word memory has an upper position compared with the last prior word memory in the fixed priority order, the priority changing part masks the match signals output from the word memories which do not belong to an effective word memory region including the first prior word memory, the last prior word memory, and the word memories having positions between the first prior word memory and the last prior word memory in the fixed priority order, and transmits the masked match signals to said priority encoder, while transmitting to said priority encoder the match signals output from the word memories which belong to the effective word memory region;
(iia) when the first prior word memory has a lower position compared with the last prior word memory in the fixed priority order and the match signal is output from at least one of the word memories which belong to a first effective word memory region including the first prior word memory and the word memories having lower positions compared with first prior word memory in the fixed priority order, the priority changing part, masks the match signals output from the word memories having upper positions compared with the first prior word memory in the fixed priority order and transmits the masked match signals to said priority encoder while transmitting to said priority encoder the match signals output from the word memories which belong to the first effective word memory region, and
(iib) when the first prior word memory has a lower position compared with the last prior word memory in the fixed priority order and no match signal is output from any one of the word memories which belong to the first effective word memory region, the priority changing part masks the match signals output from the word memories which have lower positions compared with the last prior word memory and transmits the masked match signals to said priority encoder while transmitting to said priority encoder the match signals output from the word memories which belong to a second effective word memory region including the last prior word memory and the word memories having upper positions compared with the last prior word memory in the fixed priority order.

14. The content addressable memory according to claim 13, further comprising a plurality of flag registers which respectively correspond to the word memories and which store the match/mismatch signals output from the corresponding word memories.

15. The content addressable memory according to claim 13, wherein said priority changing part includes:
   a first division circuit for dividing said plurality of word memories into the word memories in the first effective word memory region, and the word memories having upper positions compared with the first prior word memory in the fixed priority order; and
   a last division circuit for dividing said plurality of word memories into the word memories in the second effective word memory region, and the word memories having lower positions compared with the last prior word memory in the fixed priority order.

16. The content addressable memory according to claim 13, wherein:
   said priority changing part includes a determination circuit for determining whether the first prior word memory has an upper or a lower position compared with the last prior word memory in the fixed priority order in said priority encoder.

17. The content addressable memory according to claim 13, wherein:
   said priority changing part includes a detection circuit for detecting, when the first prior word memory has a lower position compared with the last prior word memory in the fixed priority order, the match signals output from the word memories which belong to the first effective word memory region,
   when said detection circuit detects the match signal output from at least one of the word memories which belong to the first effective word memory region, the priority changing part masks the match signals output from the word memories having upper positions compared with the first prior word memory in the fixed priority order and transmits the match signals output from the word memories which belong to the first effective word memory region; and
   when said detection circuit detects no match signal output from any one of the word memories which belong to the first effective word memory region, the priority changing part masks the match signals output from the word memories which have lower positions compared with the last prior word memory in the fixed priority order and transmits the match signals output from the word memories which belong to the second effective word memory region.

18. A content addressable memory comprising:
   a plurality of word memories which respectively have assigned addresses, and each outputs a match/mismatch signal representing storage or no storage of a data item matching search data; and
   a priority circuit for changing the priority of the addresses which are to be output prior to the other addresses, said priority circuit comprising:
      a priority encoder that outputs the addresses of the word memories from which the match signals are transmitted to the priority encoder in a predetermined fixed priority order; and
      a priority changing part including a detection circuit that detects the match signals output from the word memories and a division circuit that divides said plurality of word memories into lower-positional word memories and upper-positional word memories having upper positions compared with the lower-positioned word memories in the fixed priority order in said priority encoder, wherein:
      (i) when the detection circuit detects the match signals output from at least one of the lower-positional word memories, the priority changing part masks the match signals output from the upper-positional word memories and transmits the match signals output from the lower-positional word memories to the priority encoder; and
      (ii) when the detection circuit detects no match signal output from any one of the lower-positional word memories, the priority changing part transmits the match/mismatch signals output from the upper-positional word memories to the priority encoder.

19. The content addressable memory according to claim 18, further comprises a plurality of flag registers which respectively correspond to said plurality of word memories and which store the match/mismatch signals output from the corresponding word memories.

20. The content addressable memory according to claim 18, wherein:
   said priority circuit includes a first prior word memory setting section for setting a first prior word memory among said plurality of word memories; and
   the division circuit divides said plurality of word memories such that the lower-positional word memories include the first prior word memory and the word memories having lower positions compared with the first prior word memory in the fixed priority order, and that the upper-positional word memories include the word memories having upper positions compared with the first prior word memory in the fixed priority order.

21. A content addressable memory comprising:
   a plurality of word memories which respectively have assigned addresses, and each outputs a match/mismatch signal representing storage or no storage of a data item matching search data; and
   a priority circuit for changing the priority of the addresses which are to be output prior to the other addresses, said priority circuit comprising:
      a priority encoder for outputting the addresses of the word memories from which the match signals are transmitted to said priority encoder in a predetermined fixed priority order; and
      a priority changing part, wherein:
      (a) when the match signal is output from at least one of the word memories which belong to a first effective word memory region including a first prior word memory and the word memories having lower positions compared with the first prior word memory in the fixed priority order, the priority changing part masks the match signals output from the word memories having upper positions compared with the first prior word memory in the fixed priority order and transmits to said priority encoder the match signals output from the word memories which belong to the first effective word memory region; and
      (b) when no match signal is output from any one of the word memories which belong to the first effective word memory region, the priority changing part masks the match signals output from the word memories which have lower positions compared with a last prior word memory in the fixed priority order, the first prior word memory having a lower position compared with the last prior word memory in the fixed priority order, and transmits to said priority encoder match signals output from word memories which belong to a second effective word memory region including the last prior word memory and the word memories having upper positions compared with the last prior word memory in the fixed priority order.

22. The content addressable memory according to claim 21, further comprising a plurality of flag registers which respectively correspond to the word memories and which store the match/mismatch signals output from the corresponding word memories.

23. The content addressable memory according to claim 21, wherein said priority circuit further comprises:
   a first prior word memory setting section for setting the first prior word memory among said plurality of word memories; and
   a last prior word memory setting section for setting the last prior word memory among said plurality of word memories.

24. The content addressable memory according to claim 21, wherein:
   said priority changing part includes a detection circuit that detects the match signals output from the word memories which belong to the first effective word memory region;
   when said detection circuit detects the match signal output from at least one of the word memories which belong to the first effective word memory region, the priority changing part masks the match signals output from the word memories having upper positions compared with the first prior word memory in the fixed priority order and transmits to the priority encoder the match signals output from the word memories which belong to the first effective word memory region; and
   when said detection circuit detects no match signal output from any one of the word memories which belong to the first effective word memory region, the priority changing part masks the match signals output from the word memories which have lower positions compared with the last prior word memory in the fixed priority order and transmits to the priority encoder the match signals output from the word memories which belong to the second effective word memory region.

* * * * *